US007031853B2

(12) United States Patent
Kageura

(10) Patent No.: US 7,031,853 B2
(45) Date of Patent: Apr. 18, 2006

(54) INSULATION VERIFICATION SYSTEM, INSULATION VERIFICATION METHOD, AND STORAGE MEDIUM

(75) Inventor: Masaru Kageura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 10/862,924

(22) Filed: Jun. 7, 2004

(65) Prior Publication Data

US 2004/0254749 A1    Dec. 16, 2004

(30) Foreign Application Priority Data

Jun. 16, 2003    (JP)    ............................. 2003-170824

(51) Int. Cl.
*G01R 15/00*    (2006.01)
*G06F 19/00*    (2006.01)

(52) U.S. Cl. ...................................................... 702/57

(58) Field of Classification Search .................. 702/57
See application file for complete search history.

(56) References Cited

U.S. PATENT DOCUMENTS 6,587,344 B1 *    7/2003    Ross ........................ 361/704
6,714,110 B1 *    3/2004    Siu ............................ 336/96

FOREIGN PATENT DOCUMENTS

JP    2003-256498    *    9/2003

OTHER PUBLICATIONS

P.E. Hart, et al. "A formal basis for the heuristic determination of minimum cost paths," IEEE Transactions on Systems Science and Cybernetics, vol. 4, pp. 100-107, 1968.
M. Kageura & K. Shimada, "Finding the Shortest Path for Quality Assurance of Electric Components", presented at ASME 2002 DETC/DAC, Montreal, Canada, 2002.
T. Kanai & H. Suzuki, "Approximate Shortest Path on a Polyhedral Surface And Its Applications", Computer-Aided Design, vol. 33(2001), pp. 801-811.

* cited by examiner

Primary Examiner—John Barlow
Assistant Examiner—Demetrius Pretlow
(74) Attorney, Agent, or Firm—Canon U.S.A. Inc IP Division

(57) ABSTRACT

A method is provided for verifying insulation distances within electrical systems without producing actual system prototypes. A bounding box tree of each component is produced, and root node pairs are put into a queue. The distance between boxes corresponding to two nodes of the root node pair is calculated. If the distance is greater than a predetermined value, no further process is performed for this root node pair, however, if the distance is less than the predetermined value, triangular patches contained in the respective nodes are extracted, and the exact distance between the two triangular patches is calculated. If the resultant distance is less than the predetermined value, the patches are determined to be adjacent to each other. The shortest path along surfaces of components is determined via the above-described process, and verification in terms of insulation is performed on the basis of the determined shortest path.

24 Claims, 15 Drawing Sheets

VERTEX DATA
$t: V_0-V_1-V_2$
$t_0: V_{00}-V_{01}-V_{02}$
$t_1: V_{10}-V_{11}-V_{12}$
$t_2: V_{20}-V_{21}-V_{22}$

VERTEX DATA
$t: V_0-V_1-V_2$
$t_0: V_{00}-V_2-V_1$
$t_1: V_{10}-V_0-V_2$
$t_2: V_{20}-V_1-V_0$

ADJACENCY
$e_0: t_0$
$e_1: t_1$
$e_2: t_2$

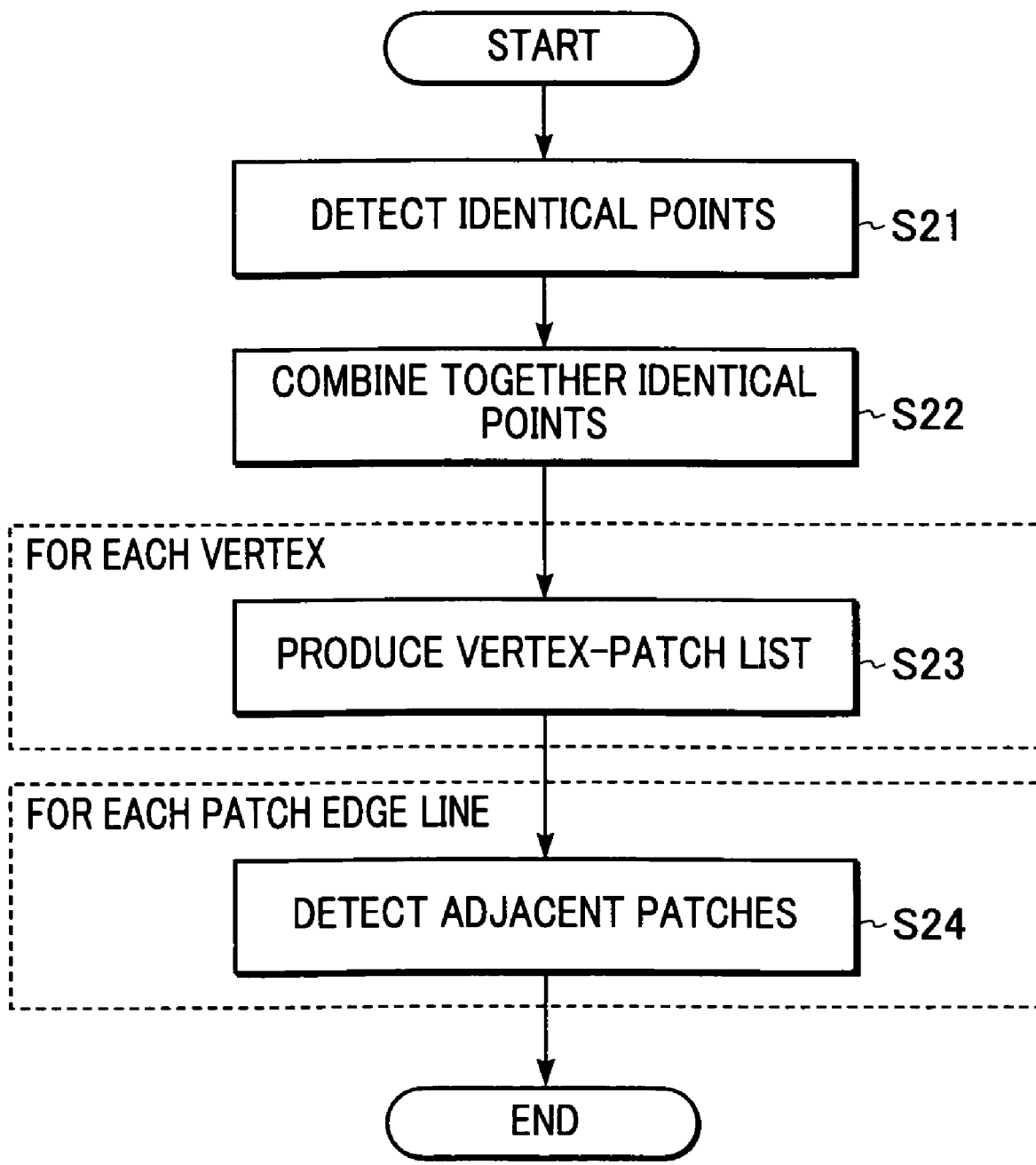

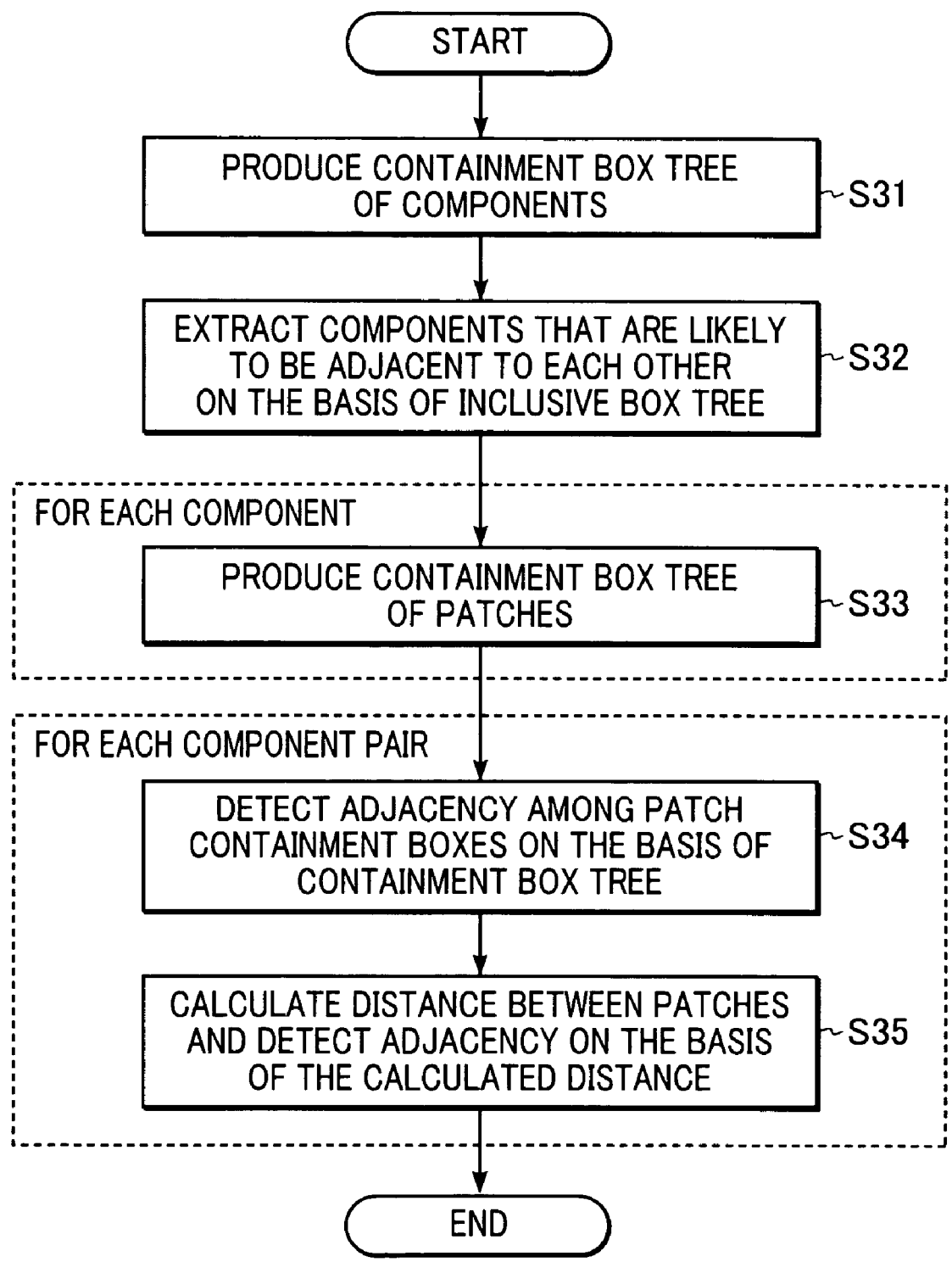

MANNER IN WHICH COMPONENTS
ARE CONNECTED

COMPONENT CONNECTION GRAPH

INITIAL GRAPH    FIRST PRODUCTION      SECOND PRODUCTION
                 OF DETAILED GRAPH     OF DETAILED GRAPH

INSULATION VERIFICATION SYSTEM, INSULATION VERIFICATION METHOD, AND STORAGE MEDIUM

BACKGROUND OF THE INVENTION

1. Field of the Invention

The present invention relates to a verification or examination system, method, program and storage medium on which the verification or examination program is stored. More particularly, the present invention relates to a system and method for verifying or examining distances within electrical systems and their respective components without producing actual electrical system prototypes.

2. Description of the Related Art

It is typical to conduct safety checks on prototype systems before the actual systems are manufactured. Conventionally, a prototype system is actually produced and tested to determine whether it has a problem.

For example, in components and/or interconnection wires to which electric voltages are applied, the distances among components and/or interconnection wires should be large enough to accommodate the required insulation. The produced prototype system is broken down into components, and voltage systems including components to which voltages are applied are analyzed. Lengths of shortest paths among electrically conductive parts in voltage systems along surfaces of components are manually measured using a measuring tool such as a vernier caliper, and the measured lengths are evaluated to determine whether they are large enough to accommodate the required insulation.

However, with this method, testing is possible only after the prototype system is produced. If a problem is detected, the system must then be redesigned, and a prototype produced and evaluated again in a similar manner. Such design, testing and redesign iterations can become costly and consume valuable resources such as time and materials.

Moreover, this process is prone to errors since the process is performed by a human designer, who analyzes and measures the voltage systems, so that there is a possibility that an incorrect path is selected and measured. Further, in some cases, an inner part of a component of a produced prototype system cannot be measured when measurement of that part is essential.

An alternative method is to use design data to determine the distance between two particular points and determine whether this distance is large enough to accommodate the required insulation.

In the art of computational geometry, several computational techniques are known for determining the shortest path between two points along a surface of a single triangular polyhedron.

However, when the distance between two points on a high-order curved surface of an object is to be determined, the shortest path along trimmed patches expressed by a plurality of equations is determined, which requires that an optimization problem for a plurality of high-order objective functions be solved. Solutions to these high-order objective functions can be difficult to obtain and no computational method is known for quickly solving these functions.

One known method of determining the distance along a surface of a simple triangular face polyhedron is to develop the surface of the polyhedron into a plane and determine the exact distance in the developed plane. Another known method is to find the shortest path using a discretely weighted approximate graph.

However, in the method of determining an exact distance in a developed plane, it is difficult to quickly obtain a solution for a polyhedron with many surfaces. In particular, no quick method is known for determining the shortest path along object surfaces, and no quick method is known for determining a creepage distance between voltage systems. It is unknown to optimize the solving process for the insulation distance problem. For example, optimization is unknown for the case in which determination of the simple creepage distance is insufficient and a spark in a spatial gap (or a park through a connection part) must be taken into account.

An example of a spark through a small spatial gap between two components is shown in FIG. 17. In this example, two components 1701 and 1702 are placed on a plane 1704 such that they are spaced apart from each other by a small gap 1703. A high voltage is then applied between the component 1701 and the plane 1704. In this structure, a spark can occur directly or indirectly between the component 1701 and the plane 1704. The indirect path extends partially along the surface of the component 1701, through the small gap 1703 to the component 1702 and then along the surface of the component 1702 to the plane 1704. In this case, the path of the spark depends on the material of the component 1703.

FIG. 18 shows an example of a spark occurring through a component. In this example, components 1801 and 1802 are in contact with each other, and a high voltage is applied between a particular part of the component 1801 and a vertex 1803 of the component 1802. In this case, depending on the material of the component 1802, the shortest path between the component 1801 and the vertex 1803 is not along the surfaces of the components 1801 and 1802 but can be through a part of the component 1802, and a spark or a leakage can occur through such a path through the component 1802.

Even one skilled in the art may have some difficulty based on the above. The skilled individual has to calculate a simple creepage distance, and then simulate the occurrence of spark or leakage through a gap or connection part. Even if the possibility of a spark is predicted, it may be difficult to predict an exact path for the spark. And, the skilled person must then determine distances, for example, insulation distances, between such components. Not only can these difficulties result in errors, they can result in loss of valuable resources such as time and material.

SUMMARY OF THE INVENTION

The present invention addresses the foregoing difficulties and drawbacks by providing a verification system, a verification program, and a verification method, capable of detecting a part that can cause an insulation problem at an early stage of designing or developing of a system without using a trial product.

In one aspect of the present invention, a bounding box tree of each component is produced, and root node pairs are put in a queue. Root node pairs are taken from the queue pair by pair, and the following process is performed until no more root nodes are in the queue. First, the distance between boxes corresponding to two nodes of the root node pair is calculated. If the calculated distance is greater than a predetermined value, no further process is performed for this root node pair. However, if the distance is less than the predetermined value, triangular patches contained in the respective nodes are extracted, and the exact distance between the two triangular patches is calculated. If the resultant distance is less than the predetermined value, the patches are determined to be adjacent to each other. The shortest path along surfaces of components is determined via the above-described process, and verification in terms of insulation is performed on the basis of the determined shortest path.

Further features and advantages of the present invention will become apparent from the following description of the preferred embodiments with reference to the attached drawings.

BRIEF DESCRIPTION OF THE DRAWINGS

FIG. 6 is a flow chart showing a process of detecting a topological structure of a triangular polyhedron in accordance with an embodiment of the present invention.

FIG. 8 is a flow chart showing a process of detecting adjacency among components.

DETAILED DESCRIPTION OF THE INVENTION

Embodiments of the present invention are described below with reference to the accompanying drawings.

In the insulation distance verification according to the present embodiment, specification information in terms of required insulation distance depending on the applied voltage and pollution degree is stored in a specification database. For each system or unit, structure information, 3D-model shape information of each component, and layout information, are extracted from 3D-CAD data, electrical characteristics of each component, information about applied voltages, information about pollution degree of each component, and other attributes needed in calculation of insulation distance are input.

Thereafter, connections among components are detected from the shape information of components and positional information such as layout information. Furthermore, it is determined which components are included in respective voltage systems, on the basis of information indicating the electrical conductivity of each component and the connections among the components. The creepage distance between voltage systems is then calculated for each possible combination of two voltage systems.

The calculated creepage distance is compared with a value described in the specification database to determine whether it satisfies the specification. If a voltage system pair that probably does not satisfy the specification in terms of the insulation distance is detected, information indicating the detected voltage system pair and a shortest creepage path are displayed on the screen.

Figure 1:
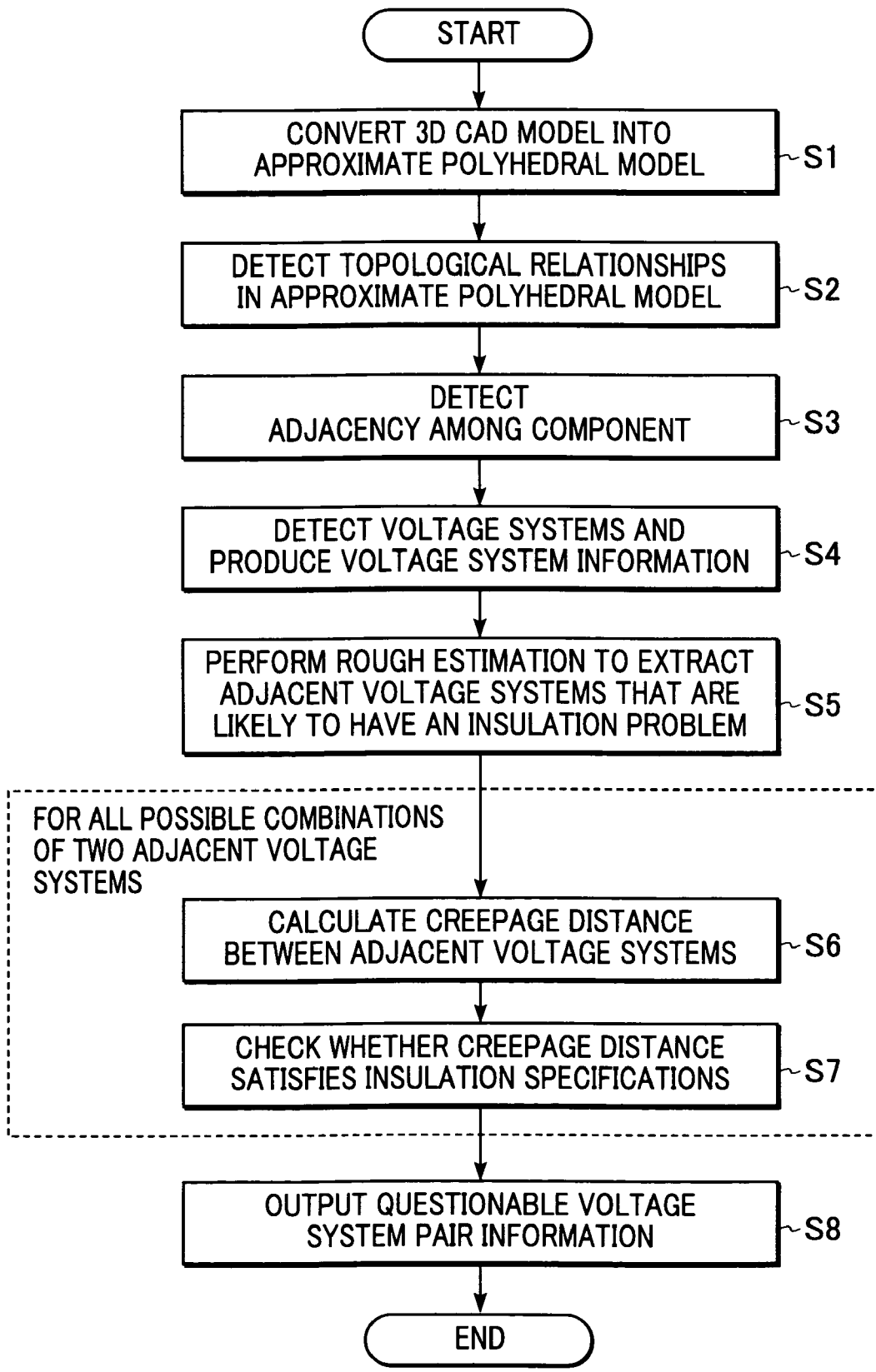
FIG. 1 is a flow chart of an insulation verification process based on a 3D model in accordance with an embodiment of the present invention.

FIG. 1 shows an outline of an insulation verification process based on a 3D model. First, a data conversion is performed in step S1. More specifically, 3D-model data indicating shapes of respective components having curved surfaces is converted into data based on approximate polyhedral model using triangular patches expressed in STL or the like. Thereafter, a topological structure based on the polyhedral model is detected in step S2. More specifically, topological relations among patches forming respective components are detected, and information indicating adjacency among patches and information indicating vertexes located at the same points are generated. In the next step S3, adjacency among components is detected. More specifically, adjacency among components is detected from the information indicating the layout of components and geometrical information about patches of components.

Thereafter, in step S4, voltage systems are determined based on component adjacency detected in step S3, and information indicating electrical conductivity characteristics of the components, and information indicating applied voltages is determined. In the next step S5, approximate examination is performed to detect questionable voltage system pairs. More specifically, adjacent voltage systems that are not likely to have the necessary insulation distance are detected by performing approximate examination on the basis of information indicating spatial distances among voltage systems and connections among components.

For the questionable voltage systems detected in step S5, the creepage distance between the voltage systems is calculated in step S6, and furthermore, in the next step S7, the calculated creepage distance is evaluated on the basis of the insulation specification. Although the "creepage distance" between voltage systems calculated in the above step S6 refers to a shortest distance along surfaces of objects between voltage systems, it is understood that "creepage distance" may refer to other distances.

In the examination of the creepage distance on the basis of insulation specification information in step S7, it is determined whether the creepage distance between the voltage systems calculated in step S6 satisfies the specification indicated by the insulation specification information. If not, adjacent voltage systems that do not satisfy the specification, the creepage path, and the length of the path are recorded in a data server. In the next step S8, information indicating a voltage system pair having a problem is output. More specifically, information indicating that the voltage system pair detected, in step S7, does not satisfy the requirement of the insulation specification information is displayed to a user on a display screen.

Thus, the process of verifying whether the insulation requirement is met according to the present invention is completed. If no voltage system with actual or potential insulation problems is detected, a "no problem" message or a "verification complete" message is displayed for viewing by the user. Note that no message may be displayed if no problem is detected.

Figure 2:
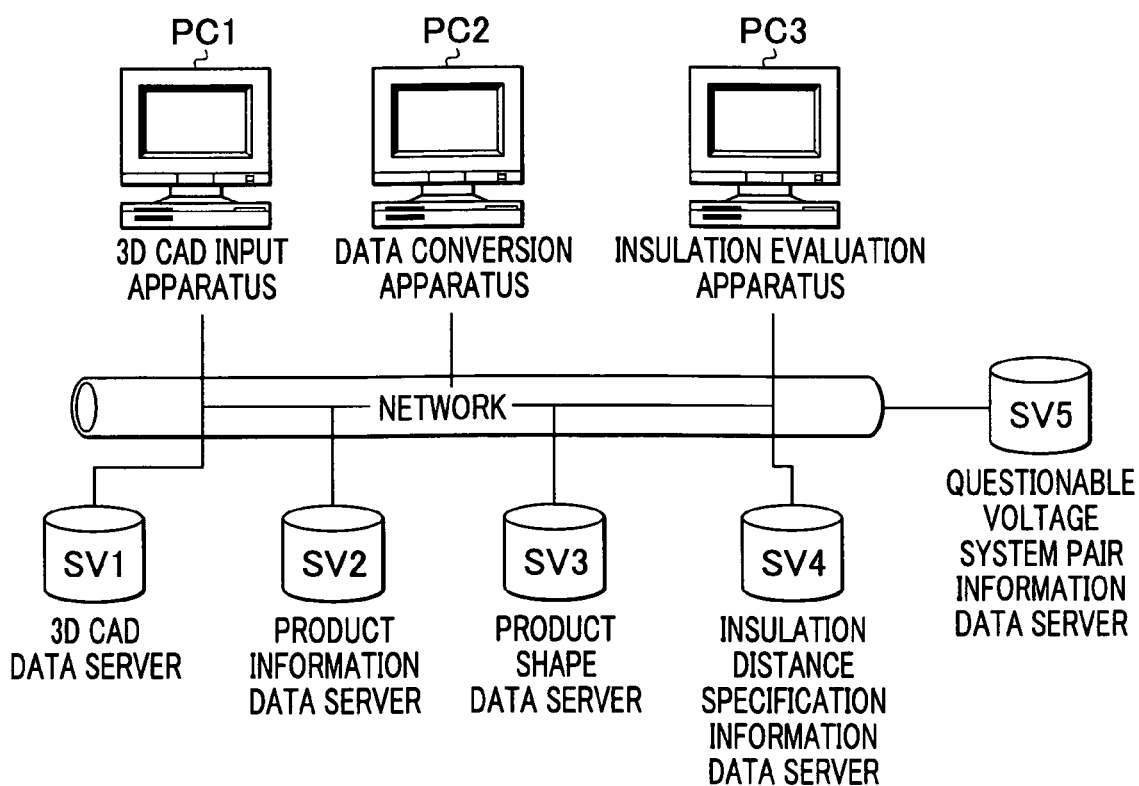
FIG. 2 illustrates an insulation verification system based on a 3D model in accordance with an embodiment of the present invention.

FIG. 2 is a diagram showing an example of an insulation verification system based on a 3D model according to the present embodiment. In FIG. 2, a PC1 (Personal Computer #1) serves as a 3D CAD input system for inputting 3D CAD information. The 3D CAD information input via the PC1 is stored in an SV1 (Server #1) serving as a 3D CAD data server. A PC2 serves as a data conversion system. An SV2 serves as a product information data server, and an SV3 serves as a product shape data server. Data obtained as a result of data conversion performed by the PC2 are stored in the SV2 or SV3. An SV4 serves as an insulation distance specification information data server in which specification information in terms of required insulation distance depending on the applied voltage and pollution degree is stored. A PC3 serves as an insulation evaluation system.

An SV5 serves as a questionable voltage system pair information data server in which information associated with voltage system pairs detected, by the PC3, not to satisfy the specified requirement in terms of the insulation distance is stored. Those PCs and SVs are communicably coupled with one another via a network.

A 3D model processed according to the method of FIG. 1 is input via PC1 (FIG. 2) and is then stored in the SV1. In step S1 of FIG. 1, the method involves using triangular patches to convert the 3D-model data including curved surfaces into a polyhedral model. This step is performed by the PC2 shown in FIG. 2 and stored in the SV3. The applied voltage information, the electrical conductivity information of the respective components, the pollution degree information, needed in the process in FIG. 1, are stored in the product information server SV2 (FIG. 2). The insulation distance specification information used in steps S5 and S7 shown in FIG. 1 is stored in the SV4 shown in FIG. 2, and this information is referred to, if necessary. Steps S2 to S8 in FIG. 1 are performed on the insulation evaluation computer PC3 shown in FIG. 2, and information indicating detected voltage system pairs having an insulation problem is stored in the questionable voltage system pair information data server SV5 so that the information can be referred, if necessary.

In FIG. 2, note that although the 3D CAD input system PC1, the data conversion system PC2 are decoupled, they can be integrated into a single unit.

The data input using the 3D CAD input system PC1 may be subjected to the insulation verification process without sending the data to the 3D-CAD data server.

Figure 3:
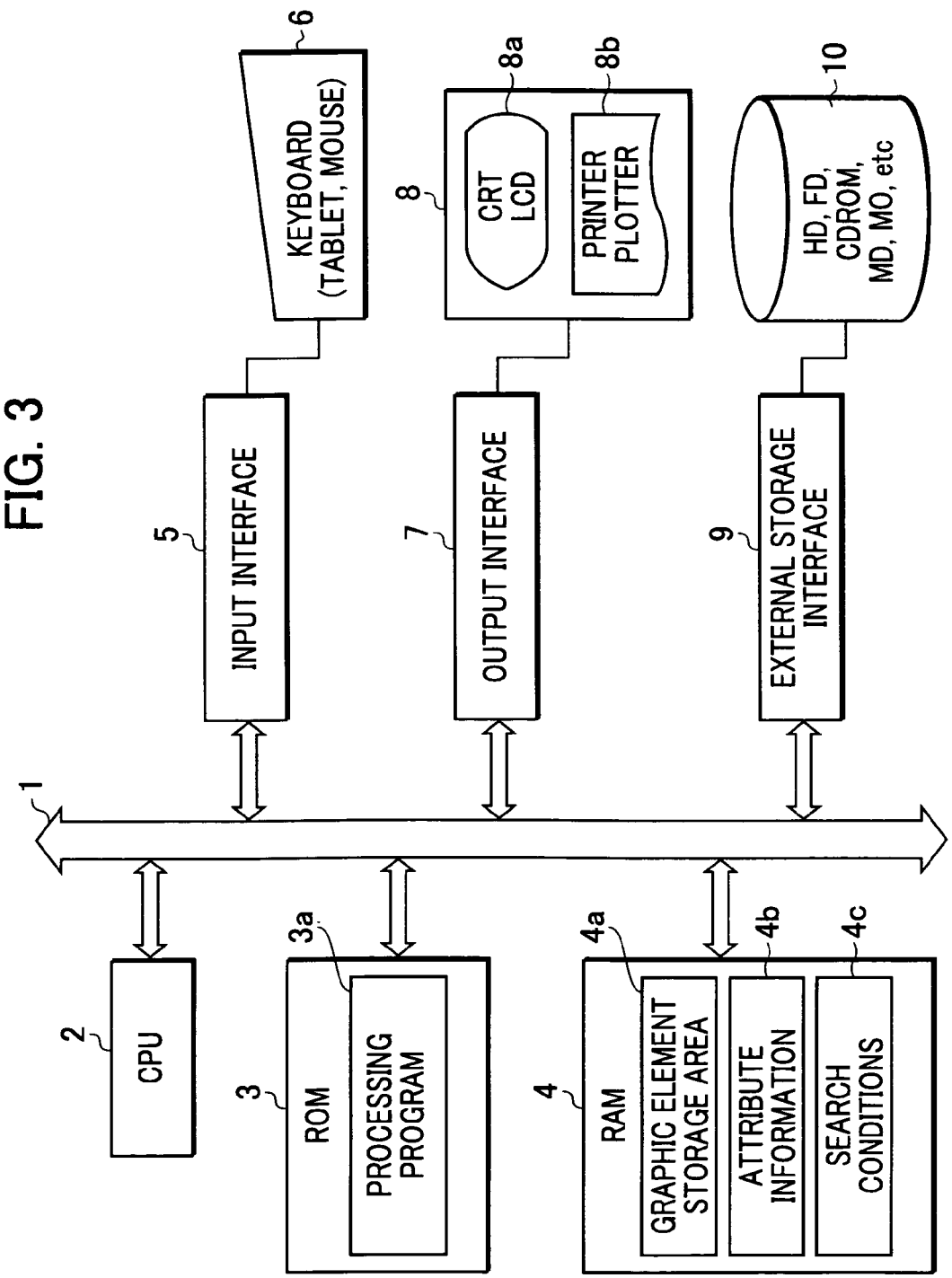
FIG. 3 is a block diagram showing a main computation system for performing insulation verification in accordance with an embodiment of the present invention.

FIG. 3 is a block diagram showing an example of the configuration of the insulation evaluation system PC3 by which steps S2 to S8 shown in FIG. 1 are performed.

As shown in FIG. 3, the insulation evaluation system PC3 includes a data bus 1 for transmitting data within the system or to other devices via a network, a CPU 2 for performing calculations in steps S2 to S8, a ROM 3 for storing a program according to which to perform the process, a high-speed storage device (RAM) 4 for storing data to be processed, an input/output device such as a keyboard and a mouse 6 and an interface therefor 5, a display/output device such as a CRT display, a liquid crystal display, or a printer 8 and an interface therefor 7, a storage device such as a hard disk drive 10 for storing data to be processed and data obtained as a result of the process and an interface therefor 9.

Commands issued by a user in steps S2 to S8 in FIG. 1 are input via the input device 6, and data indicating an intermediate or final result of the process is output from the output device 7. The data needed in the insulation evaluation process is supplied from the 3D CAD system PC1 via the network or input via the input device 6 via the interface 5 and stored in the RAM 4 via the network and the data bus 1. Data may be read from the storage device 10 and stored in the RAM 4 via the interface 9. The CPU 2 performs the insulation evaluation process using the data stored in the RAM 4 in accordance with a program stored in the ROM 3. During the process, temporary and intermediate result data are stored in the storage device 10, and final data sent via the data bus 1 and the network to servers for storage.

The process of steps S1 to S8 shown in FIG. 1 is described in further detail below.

In step S1, using the data conversion system PC2, data based on a polyhedron-approximated model is generated from data based on a 3D CAD model including curved surfaces generated by the 3D CAD system PC1, and the resultant data based on the polyhedron-approximated model is stored in the data server SV3.

In this specific embodiment, a polyhedron with triangular faces is used in the polyhedron-approximated model. Note that a polyhedron with general polygonal faces can be converted into a polyhedron with triangular faces by dividing each polygonal face into triangular areas. Herein, each face of a polyhedron is referred to as a "patch". In the case in which a face is triangular, the face is also called a "triangular patch". For example, a format called STL (Stereo Lithography) format may be used to represent a polyhedron composed of triangular patches.

Figure 4:
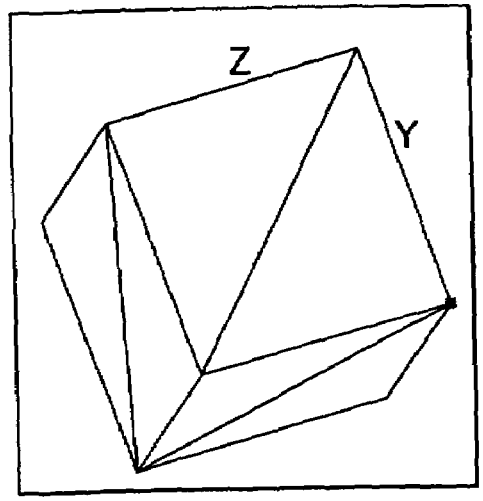
FIG. 4 illustrates an approximate polyhedron with triangular patches in accordance with an embodiment of the present invention.

FIG. 4 shows an example of a cube represented by triangular patches. As can be seen from FIG. 4, the cube is formed of a combination of triangles.

Herein, it is assumed that a polyhedron represented in the STL format or the like has geometrical data information in terms of vertexes of each patch and information indicating the outer or inner surface of each face depending on the rotation direction of vertexes, but does not have topological data indicating which patches are adjacent to each other or which vertexes are shared by adjacent patches.

Figure 5A:
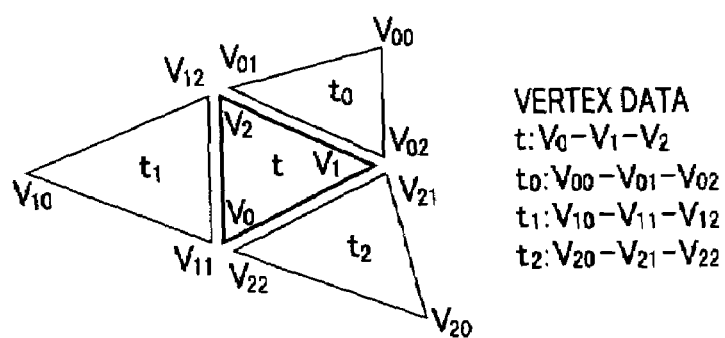
FIGS. 5A and 5B illustrate topological information of a triangular polyhedron.

In a specific example shown in FIG. 5A, for example, a triangle t is in contact at its respective sides with other triangles $t_0$, $t_1$, and $t_2$. In the case of the STL format, data includes information indicating a rotation direction of vertexes of each triangle. Note that the rotation direction is positive when it is in a counterclockwise direction, and an area surrounded by sides extending from one vertex to another in the positive rotation direction is an outer surface of a triangular patch.

Figure 5B:
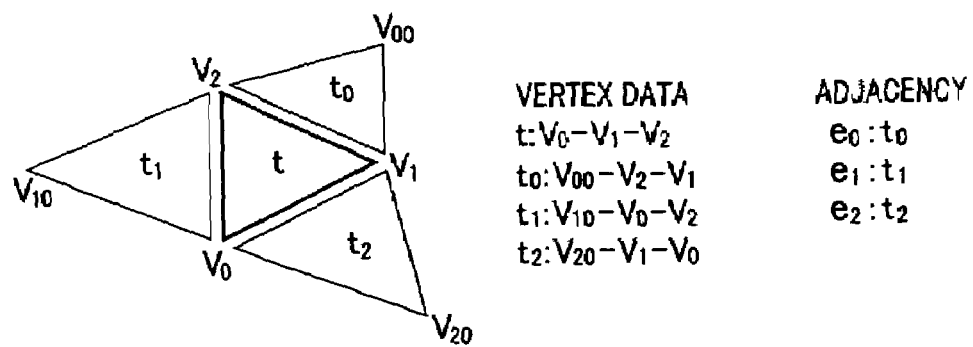

In an example shown in FIG. 5B, data representing a polyhedron has topological data in addition to vertex data. The data including topological data indicates triangles whose vertexes are shared by adjacent triangles. The data also includes vertex data, and adjacency at each side between triangles. In the example of FIG. 5B, the topological data indicates that vertexes are shared by adjacent triangles and the triangle t adjoins other triangles such that the triangle t adjoins a triangle $t_0$ at a side opposite to a vertex $V_0$, a triangle $t_1$ at a side opposite to a vertex $V_1$, and a triangle $t_2$ at a side opposite to a vertex $V_2$. The representation in this manner makes the data less sensitive to noise. For example, even when geometric vertex data is changed by noise and an inconsistency occurs in terms of vertexes between adjacent triangles, the data can be correctly treated with if the change is within an allowable small range.

In step S2 of FIG. 1, the topological structure of the approximate polyhedron composed of triangular patches generated in step S1 is detected. That is, data such as that shown in FIG. 5B is generated from data such as that shown in FIG. 5A.

FIG. 6 is a flow chart showing the process of detecting the topological structure and generating, for example, the data shown in FIG. 5B from the data shown in FIG. 5A.

In step S21, vertexes located at the same points are detected. More specifically, all vertexes of triangular patches forming the polyhedron are examined to detect vertexes located at the same points. If two or more vertexes are located within a predetermined small range, those vertexes are regarded as being located at the same point. If all possible combinations of points are examined to detect vertexes located at the same points, the detection takes a long time. In the present embodiment, to avoid the above problem, a data structure called KD-Tree is used to reduce the number of combinations to be examined, thereby making it possible to perform the detection process in a short time.

A specific example of the process is described below with reference to FIG. 7. First, from input geometrical vertex data of triangular patches with no topological information, vertexes located at the same points are detected such that $V_0$, $V_{11}$, and $V_{22}$ are all located at a (same) point, $V_1$, $V_{02}$, and $V_{21}$ are all located at another (same) point, $V_2$, $V_{01}$, and $V_{12}$ are all located at still another (same) point. In the next step S22, vertexes determined to be at the same points are combined such that they are represented by a single vertex. As a result, topological information identifying vertexes at the same points is obtained. In the specific example shown in FIG. 7, this process is denoted by an arrow with a label "COMBINE IDENTICAL POINTS INTO SINGLE-POINT".

Thereafter, from the shared-point information produced in the previous step, vertexes $V_{11}$ and $V_{22}$ are replaced with a vertex $V_0$, vertexes $V_{02}$ and $V_{21}$ are replaced with a vertex $V_1$, and vertexes $V_{01}$ and $V_{12}$ are replaced with a vertex $V_2$, and patch data indicating patches based on the replaced vertexes is produced. In the next step S23, a vertex-patch list is produced. More specifically, a list indicating patches having a vertex located at the same point is produced for each vertex.

Figure 7:
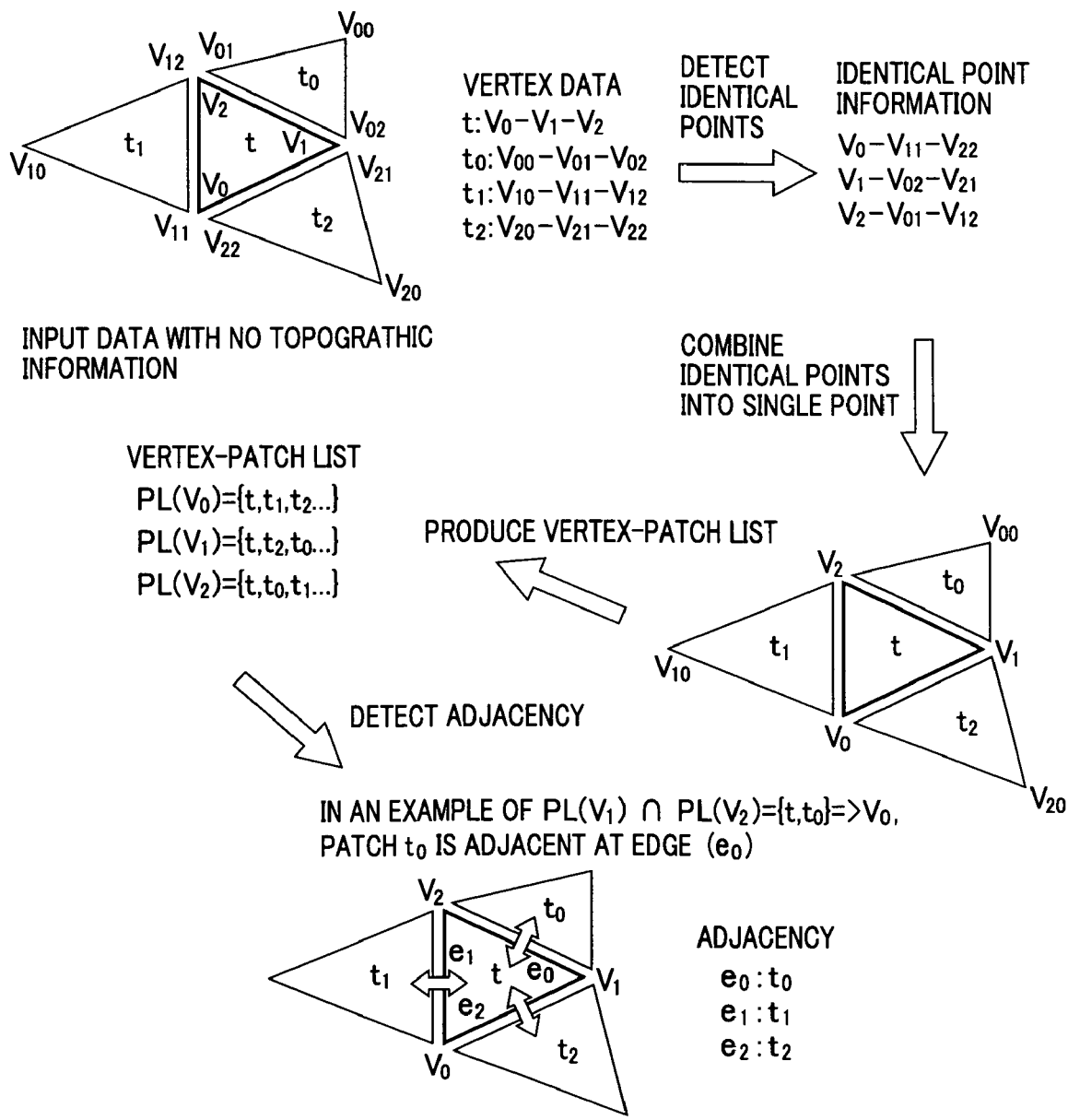
FIG. 7 is a diagram showing a process of detecting a topological structure of a triangular polyhedron in accordance with an embodiment of the present invention.

In the specific example shown in FIG. 7, triangular patches t, $t_1$, and $t_2$ are described in a list for a vertex $V_0$ because the vertex $V_0$ is shared by those triangular patches, triangular patches t, $t_2$, and to are described in a list for a vertex $V_1$ because the vertex $V_1$ is shared by those triangular patches, and triangular patches t, $t_0$, and $t_1$ are described in a list for a vertex $V_2$ because the vertex $V_2$ is shared by those triangular patches. In the next step S24, adjacency among patches is detected. More specifically, when one side of a particular triangular patch is examined, patches adjoining each other at this side are given by the AND of patch lists of two points at the ends of this side. If the result of the AND of patch lists includes a patch other than the patch of interest, then this patch is a patch that adjoins, at the side of interest, the patch of interest. The detection of adjacent patches is performed for each side of each patch.

In the specific example shown in FIG. 7, when a side $e_0$ of a patch t is examined, end points of this side are given as $V_1$ and $V_2$. Patch lists for points $V_1$ and $V_2$ are extracted from the patch lists produced in step S24, and the AND of those patch lists is calculated. A list of patches obtained as a result includes the patch t and the patch $t_0$, which is detected as a patch other than the patch t of interest, that is, the patch $t_0$ is detected as a patch adjacent at the side $e_0$ to the patch t.

Referring again to FIG. 1, in step S3, adjacency among components is detected from the spatial locations of the components and the geometrical information of patches forming respective components. The adjacency detection process is described in detail below with reference to the flow chart of FIG. 8. When the shortest distance between two components is less than a predetermined value, those two components are regarded as adjoining each other. The shortest distance between two components is given by the shortest distance between triangular patches forming the respective components. Generally, the shortest distance is determined by calculating the distances between two patches for each possible combination of two patches for each possible combination of two components.

In the present embodiment, in order to perform the calculation in a short time, combinations of two components that are likely to be adjacent to each other are first extracted. To this end, in step S31, a bounding box tree such as an AABBTree (Axis-Aligned Bounding Box Tree) or an OBBTree (Oriented Boundary Box Tree) of components to be processed is produced. The box tree is formed of leaves corresponding to boxes containing respective components such that boxes belong to an upper-level node.

The AABBTree and the OBBTree are different in the manner in which boxes are formed. In the AABBTree, boxes are formed such that sides of each box are parallel with XYZ axes of space coordinates. On the other hand, in the OBBTree, boxes are formed using a statistical process such that each box fits an object well and can be oriented in an arbitrary direction in the space.

In the next step S32, all possible combinations of two components that are likely to adjoin each other are extracted in an efficient manner using the bounding box tree. More specifically, the distance between boxes is first examined. If the distance between two boxes is less than a predetermined value, the distance between actual corresponding components is calculated in steps S33 and S34 thereby achieving a reduction in processing time.

For two components likely to adjoin each other, a bounding box tree is generated in step S33 such that the tree includes leaves corresponding to boxes containing respective components, and the shortest distance is quickly calculated by using the generated bounding box tree. This makes it possible to detect, in an efficient manner, adjacent patches forming the respective components and calculate the shortest distance without having to calculate the distance for all possible combinations of two patches.

Figure 9A:
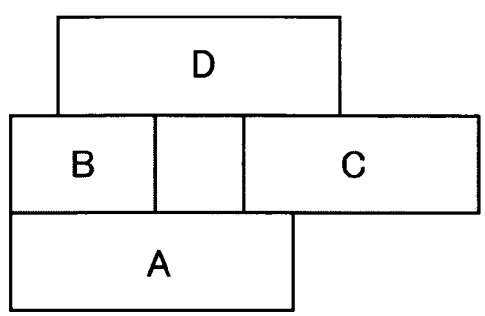
FIG. 9A is an illustration of how adjacent components are connected.
Figure 9B:
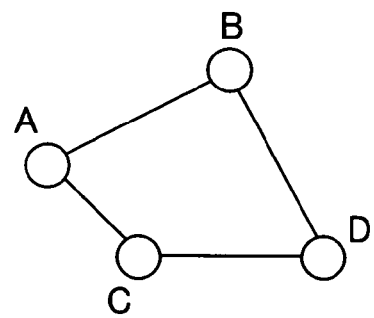
FIG. 9B is a graphical representation of the same.

Thereafter in step S34, combinations of two probable adjoining nodes of boxes containing patches are detected using the bounding box tree in a similar manner as in step S32. In the next step S35, the exact distance between two patches detected as probable adjoining patches is calculated. If the calculated distance is less than the predetermined value, it is determined that the two patches adjoin each other. The detected adjacency among components is stored in a storage device, and is also illustrated in FIGS. 9A and 9B. Specifically, FIG. 9A is an illustration of how adjacent components are connected, and FIG. 9B is a graphical representation of the same.

In FIG. 9B, each node corresponds to a component, and two nodes are connected by an edge if components corresponding to those nodes adjoin each other. This graph is called a "component connection graph". In the specific example shown in FIG. 9B, components A, B, C, and D are nodes, connected via edges so as to indicate that the component A adjoins the components B and C, the component B adjoins the components A and D, the component C adjoins the components A and D, and the component D adjoins the components B and C. Thus, the component connection graph of FIG. 9B is obtained for components connected with each other in the manner shown in FIG. 9A.

Referring again to FIG. 1, in step S4, voltage system information is produced from both the component connection graph produced in step S3 and product information stored in the product information data server SV2. Voltages system information is also produced from information about electrical conductivity characteristics of respective components, and information about applied voltages. Herein, voltage system information includes but is not limited to information indicating electrically conductive components, connections among components, and applied voltages. Each voltage system is produced from the component connection graph by removing nodes corresponding to insulating (non-conductive) components and removing edges connected to such nodes. The process is described below with reference to the graph of FIG. 10.

Figure 10:
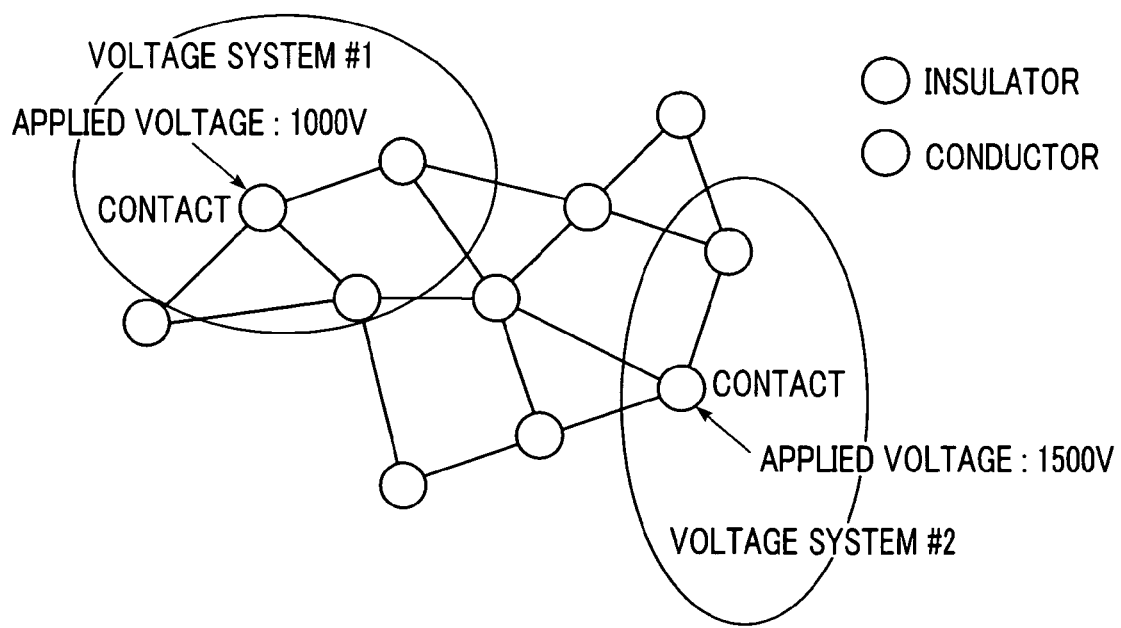
FIG. 10 is a diagram showing voltage systems.

FIG. 10 shows a component connection graph indicating connection among components. In this example, of components in the component connection graph, conductors connected to one another are extracted and combined together as a voltage system. In the example shown in FIG. 10, a voltage of 1000 volts is applied to a contact in a voltage system #1, and voltages on electrically conductive parts connected with each other become equal (that is, an equal voltage is applied to them). On the other hand, in a voltage system #2, a voltage of 1500 volts is applied to a contact, and the same voltage as that applied to the contact is applied to conductors connected to the contact. That is, 1500 volts is applied to the conductors in the voltage system #2.

As described above, a voltage system is a group of electrically conductive components that are connected with each other directly through no insulator and thus that are equal or substantially equal in voltage. In this specific example shown in FIG. 10, there are two voltage systems #1 and #2. In each graph, connection components can be detected by searching for nodes and edges that can be reached starting from a certain node on the basis of the connection information described in the component connection graph. The applied voltage information indicates a highest voltage applied to components in each voltage system. When no voltage is applied, the applied voltage information has an attribute "no voltage applied".

In step S5 in FIG. 1, on the basis of spatial distances between voltage systems and the component connection information, combinations of two voltage systems that probably do not satisfy the requirement in terms of the insulation distance are extracted. More specifically, first, necessary creepage distances are determined from the voltages applied to the respective voltage systems and the insulation distance specification information stored in the insulation distance specification information data server SV4.

Thereafter, boxes each containing voltage systems of interest are generated, and furthermore, a bounding box tree is generated such that the tree has leaf nodes corresponding to the respective boxes. Using this bounding box tree, the spatial distances between boundary boxes are calculated and compared with the necessary creepage distances determined above, thereby extracting combinations of two voltage systems that probably do not satisfy the requirement in terms of the insulation distance. If the spatial distance between two voltage systems is greater than the necessary creepage distance, those two voltage systems meet the requirement in terms of the insulation distance because the creepage distance between those two voltage systems is greater than the spatial distance, and thus it is not necessary to perform further examination in terms of creepage distance for combinations of such two voltage systems. Note that combinations of two voltage systems the distance between which is smaller than a predetermined value can be extracted efficiently in a similar manner to the manner in which adjacency among components is detected.

Figure 11:
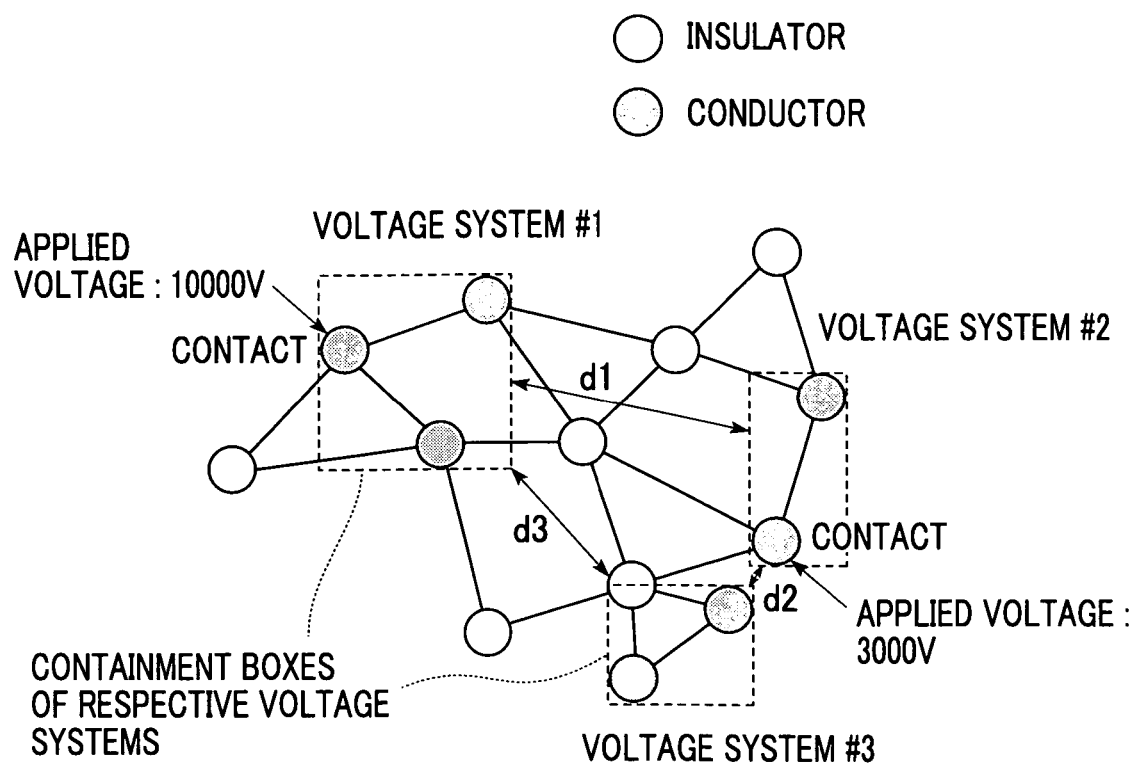
FIG. 11 a diagram showing an approximate process of extracting a voltage system pair that possibly has an insulation problem.

FIG. 11 shows a component connection graph similar to that shown in FIG. 10, wherein voltage systems detected in the graph are also shown. Here, voltage system #1, voltage system #2, and voltage systems #3 are shown. A 1000V voltage is applied to voltage system #1, and a 3000V voltage is applied to voltage system #2. Although no voltage is applied to the voltage system #3, a spark that can cause damage may be induced in it. Thus, voltage system #3 with a 0V applied voltage is also taken into account. In FIG. 11, for example, when the necessary creepage distance is $d_0$, if $d_2 < d_0 < d_3 < d_1$, then only a combination of voltage systems #2 and #3 can result in a creepage distance, which is less than the required value.

For each voltage system, a bounding box tree having leaf nodes corresponding to bounding boxes containing components included in each voltage system is produced, and combinations of two components contained in bounding boxes the distance between which is less than the necessary creepage distance are extracted. The distance between two components is quickly calculated for all combinations using the bounding box tree in a similar manner as described earlier. If the calculated distance is less than the necessary creepage distance, then the pair of voltage systems including the respective components is regarded as possibly not satisfying the insulation distance requirement.

Stop

Figure 12:
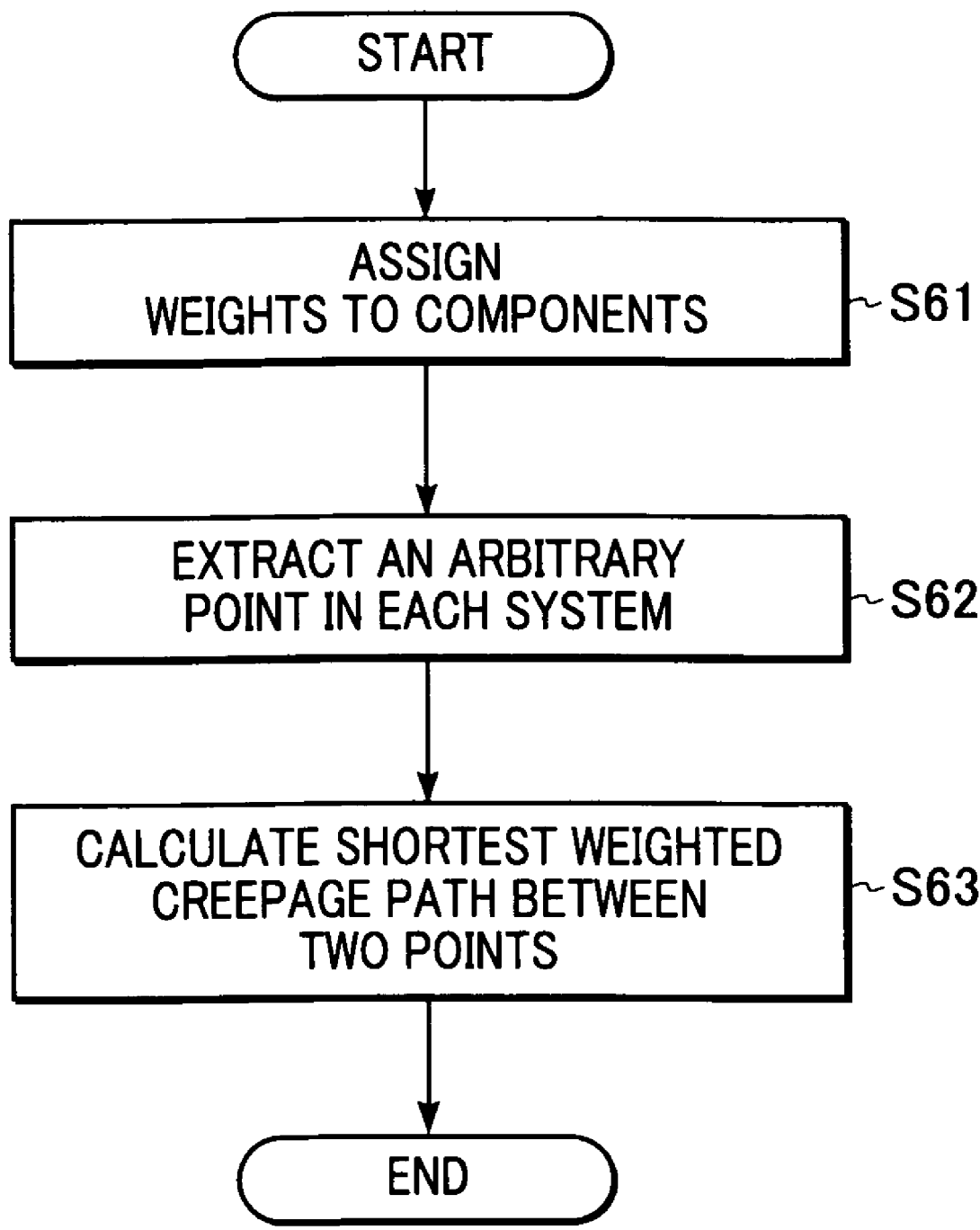
FIG. 12 is a flow chart showing a process of calculating a creepage distance between voltage systems.

In step S6 in FIG. 1, the creepage distance, that is the shortest distance along the surfaces of objects between voltage systems is calculated. The calculation process is described below with reference to a flow chart shown in FIG. 12.

First, in step S61, weights are assigned to respective components depending on the degree of ease for components to pass a spark. For electrically conductive components, the weight is set to 0, and for insulating components, the weight is set to 1. By assigning weights to respective components depending on the electrical conductivity of the components, the calculated creepage path becomes a better approximation of a true path.

In step S62, an arbitrary point of each voltage system is selected.

In step S63, the weighted shortest creepage path between two selected points of voltage systems is calculated. That is, the shortest creepage path along the surfaces of the components is calculated taking into account the weights assigned to components. In the present embodiment, the length of the path is not based only on the Euclidean distance but is based on the Euclidean distance multiplied by weights assigned to the components on the path. If the weighted shortest path between two points is calculated by assigning a weight of 0 to conductors and 1 to insulators, then the obtained path gives the creepage distance, that is, the shortest distance along the surfaces of insulators between two points, as is discussed in a paper by Kageura et al. (M. Kageura and K. Shimada, "Finding the Shortest Path for Quality Assurance of Electric Components," presented at ASME 2002 DETC/DAC, Montreal, 2002).

Figure 13:
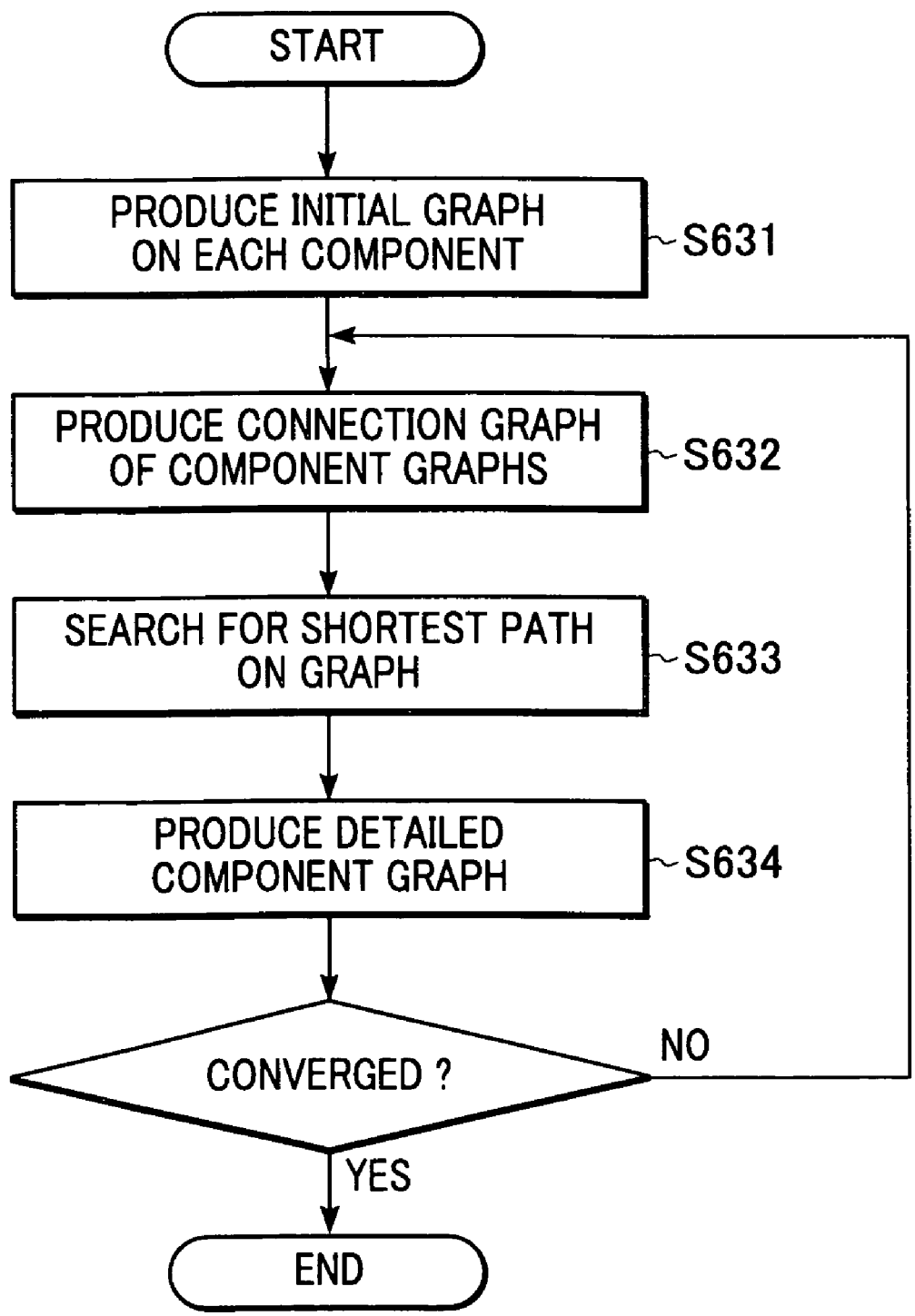
FIG. 13 is a flow chart showing a process of calculating creepage distance between two points.

The details of the process, in step S63, of determining the shortest path between two points taking into account the weights assigned to respective components are described below with reference to the flow chart of FIG. 13. First, in step S631, an initial graph of each component is produced as will be described in detail below. In the next step S632, a graph is produced by connecting the graphs of respective components, as will be described in detail below.

In step S633, the shortest path on the connected graphs is searched for. Several techniques of searching for the shortest path in an efficient manner are known. Examples were proposed by Dijkstra (E. W. Dijkstra, "A note non two problems in connection with graphs," Numersiche Mathematik, vol. 1, pp. 269–271) and an algorithm called A* (A star) (P. E. Hart, N. J. Nilsson, and B. Raphael, "A formal basis for the heuristic determination of minimum cost paths," IEEE Transactions on Systems Science and Cybernetics, vol. 4, pp. 100–107, 1968). Either one or a combination of these techniques may be used in searching for the shortest path. After finding the shortest path on the graph, a more detailed graph of components located along the detected shortest path is produced in step S634, as will be described in detail below. The above-described process starting with generation of the connection graph is performed repeatedly. If the difference between the length of the shortest path obtained in the first iteration and that obtained in the second iteration becomes smaller than a predetermined value, it is determined that the calculation has converged, and the calculation is ended.

The details of the process, in step S631, of producing an initial graph are as follows. First, interpolated points called Steiner points are produced on each edge of the polyhedron, at intervals specified by a user such that Steiner points are also put on respective vertexes of each triangular patch, and those points are employed as nodes of the graph.

Figure 14:
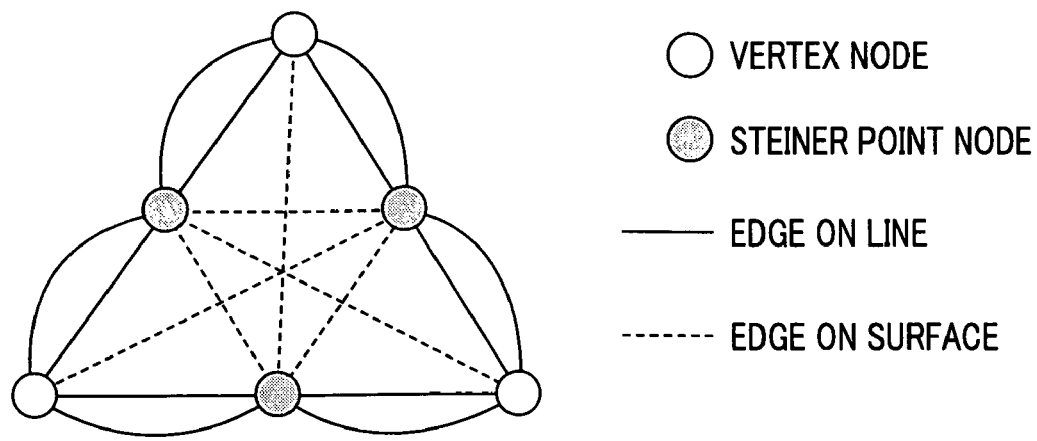
FIG. 14 is a diagram showing a process of generating an initial graph when the creepage distance between two points is calculated.

Thereafter, an edge is produced on the graph between two nodes satisfying conditions described below on each triangular patch of the polyhedron. An example of a graph including edges produced between nodes is shown in FIG. 14. Edges may be produced in one of two manners described below. (1) Edges are produced on side lines between two adjacent nodes located on the same side line of each triangular patch (such edges are referred to as edges on line), or (2) edges are produced between two nodes located on different side lines of each triangular patch such that edges extend on the face of the triangular patch between two nodes (such edges are referred to as edges on face). The same weight is assigned to each edge as the weight assigned to a component on which the edge is located.

The weighted graph produced on each component in step S632 are connected with each other as follows. First, for each node of interest, a triangular patch which is on a component other than a component on which the node of interest is located and which is closest to the node of interest within a predetermined range is searched for. A specific technique of searching for such a patch in a short time will be described below.

Figure 15:
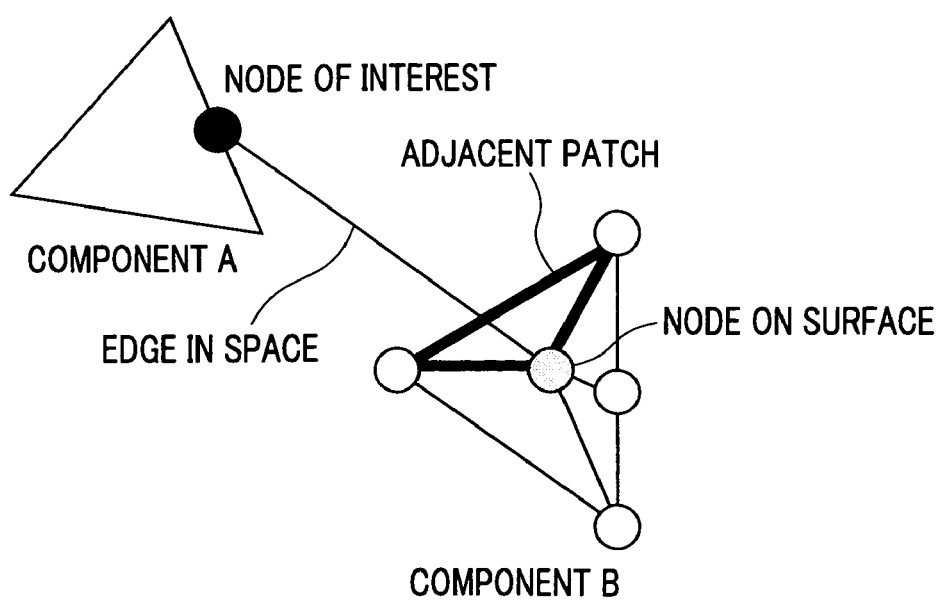
FIG. 15 is a diagram showing a process of generating a connection graph of component graphs.

If an adjacent patch satisfying the above condition is found and if there is a node of a graph on that patch, the following process described below with reference to FIG. 15 is performed. First, the distance between the node of interest on a component A and an arbitrary point on the adjacent is considered, and a point on the adjacent patch that results in a shortest distance is determined. The determined point on the adjacent patch is employed as a node of the graph on the component of the adjacent patch. Such a point is referred to as a "node on face".

Thereafter, edges are produced between the node on face of the adjacent patch and respective nodes on vertexes of the adjacent patch. Furthermore, an edge is produced between the node of interest and the node on face produced on the adjacent patch. Such an edge is referred to as an "edge in space". Via the process described above, the graphs produced on the respective components are connected, and an overall graph is obtained as a result of the connection.

A technique that searches for an adjacent patch located within a predetermined close range from a node of interest is described as follows.

First, patches of other components located within a predetermined range from an edge line of each component are extracted. A specific technique of searching for such patches will be described below. Thereafter, the shortest distance between the edge line on which the node of interest is located and an adjacent patch located within the predetermined range is determined for all adjacent patches, and an adjacent patch closest to the edge line of interest is found.

The technique used to search for patches of other components located within the predetermined range from an edge line of each component is now described as follows. First, pairs of patches located on different components located close to each other within a predetermined small range are extracted in advance. A specific technique of extracting such patch pairs will be described below. For each sideline of a patch of each extracted patch pair, the shortest distance between the sideline and the other patch of the patch pair is determined. If the shortest distance is less than a predetermined value, then the other patch of the patch pair is registered as a patch adjacent to the sideline.

Now, the specific technique of extracting pairs of patches that are on different components and that are located close to each other within the predetermined small range is described. Note that for any pair of patches located on components determined not to be within the predetermined range, the distance between patches of the pair is greater than the predetermined value without exception, and thus it is not necessary to further examine such a pair.

To extract all pairs of patches located close to each other within the predetermined range, the extraction process is performed as follows.

First, bounding box trees corresponding to respective components are produced, and root node pairs are placed in a queue. Root node pairs are taken from the queue pair by pair, and the following process is performed until the queue is empty. First, the distance between boxes corresponding to two nodes of the root node pair is calculated. If the calculated distance is greater than a predetermined value, no further process is performed for this root node pair. However, if the distance is less than the predetermined value, the following process is performed. In a case in which both nodes of a root node pair are leaf nodes, the exact distance between triangular patches in the respective nodes is calculated. If the calculated distance is less than the predetermined value, it is determined that this patch pair is a pair of adjacent patches.

On the other hand, in a case in which one node of the patch pair is a leaf node and the other is a non-leaf node, a node pair each including the leaf node and one child node of the non-leaf node is produced for each child node of the non-leaf node, and the produced node pairs are put in a queue. In a case in which both nodes of the patch pair are non-leaf nodes, a node pair each including one node of the patch pair and one child node of the other node is produced for each of possible combinations and the produced node pairs are placed in a queue. Herein, of two nodes of a given patch pair, either node and a child node of the other node may be combined into a pair. Preferably, for example, a node corresponding to a greater box may be selected.

Now, a technique of producing a more detailed graph of components located along the detected shortest path is described as follows. First, all nodes and all edges are removed except for nodes through which the determined shortest path passes and nodes that are located directly adjacent to any node through which the determined shortest path passes and that are located on the same side line of a triangular patch as that on which the node through which the determined shortest path passes. Thereafter, a predetermined number of new nodes are inserted between adjacent nodes located on each triangular patch. Furthermore, edges are produced in the same manner as are produced in the initial graph thereby producing a detailed graph associated with nearby parts along the shortest path.

Figure 16:
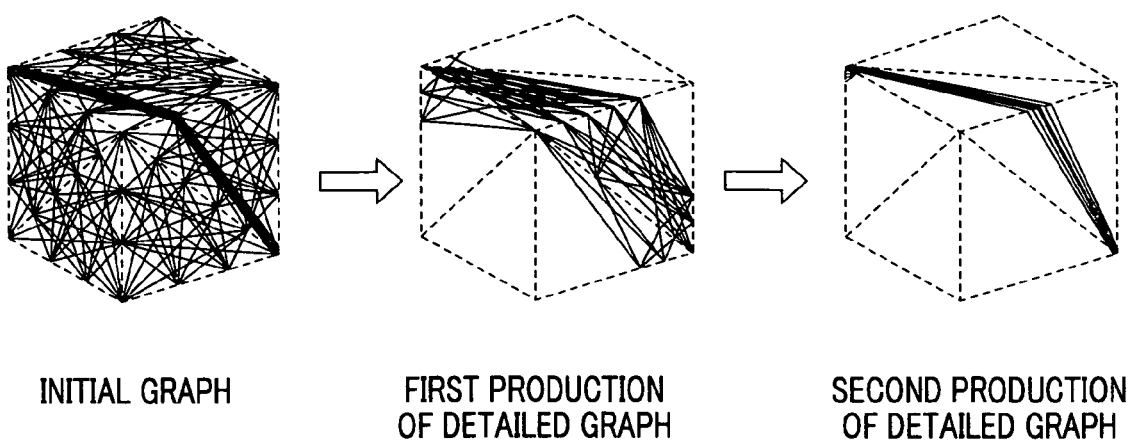
FIG. 16 is a diagram showing an example of a process of producing more detailed graphs.
Figure 17:
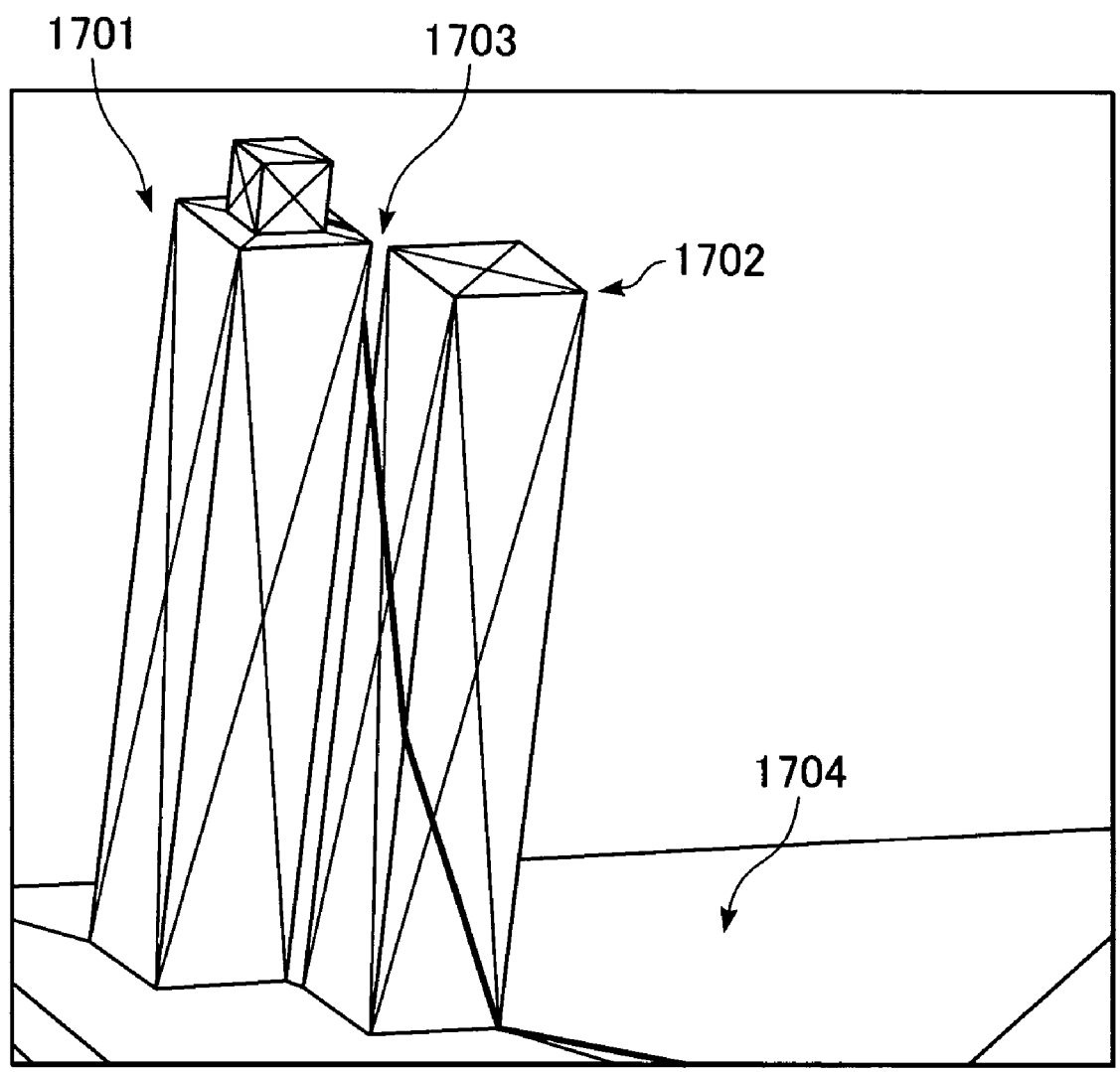
FIG. 17 is a diagram showing a spark through a small spatial gap between two components.
Figure 18:
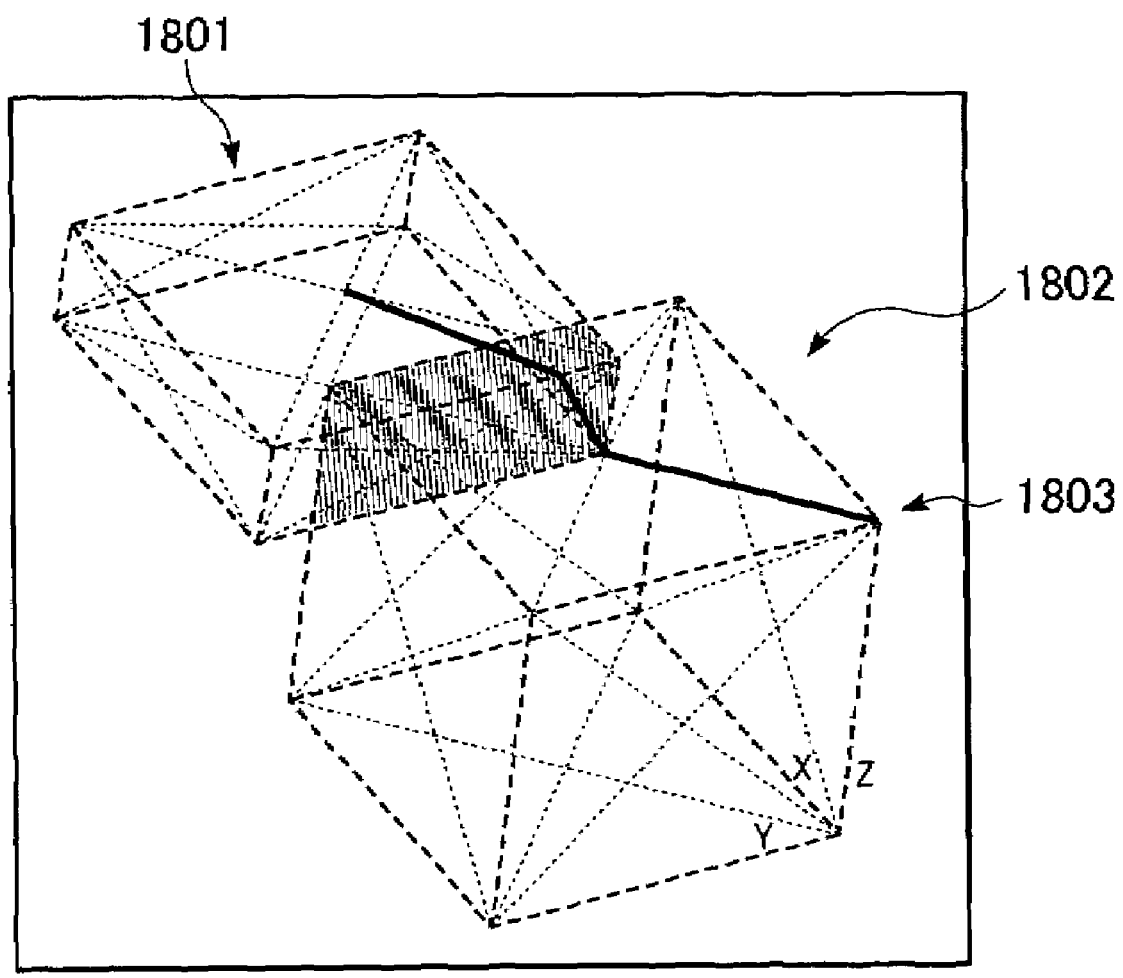
FIG. 18 is a diagram showing a spark occurring through one component, which is contact with another component.

FIG. 16 shows examples of detailed graphs for a cube. An initial graph is produced over the entire surface of the cube such that each vertex and points located at arbitrary positions on each edge of the cube becomes nodes on the graph, and edges of the graph are produced by drawing lines over each patch between possible combinations of two nodes. Next, the shortest path is searched for. As shown on the initial graph of FIG. 16, the thick line is the shortest path found. In a first-time production of a detailed graph, the graph is produced so as to include nearby components along the shortest path. On the produced graph, a new shortest path is again searched for. Thereafter, a more detailed graph is produced in a similar manner along the newly found shortest path. The above process is performed repeatedly until a final shortest path is found. This process then makes it possible to find the shortest path within a relative short time duration.

Referring again to the flow chart shown in FIG. 1, in step S7, it is determined whether the creepage distance calculated in step S6 satisfies the specification described in the insulation specification information. If a voltage system pair that does not satisfy the specification is found, information indicating the detected voltage system pair, the creepage path between the voltage system of that pair, and the length of the creepage path is stored in the data server.

In step S8, information associated with the off-specification voltage system pair detected in step S7 is displayed on the display screen.

As described above, the present invention resolves the foregoing problems of conventional systems by providing a verification system, the verification program, and the verification method, capable of automatically verifying whether a designed system satisfies a particular standard, criteria or specification, for example, whether a specified insulation distance along surfaces of components between voltage systems of the designed system is met. Such verification may be based on design data indicating component shapes based on a 3D CAD model, electrical characteristics of the components, and voltages applied to the components, without having to actually produce a prototype of the designed system.

The verification system, the verification program, and the verification method according to the present invention are capable of detecting a part that can cause an insulation problem at an early stage of designing or developing of a system.

Another advantage is that the verification system, the verification program, and the verification method according to the present invention make it possible to reduce both time and cost needed to design and develop a system.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A system for verifying insulation distances of a device that includes a plurality of components, the system comprising:

acquisition means for acquiring information about components, wherein said information about components includes information about shapes of the components, information about the layout of the components, information about materials of the respective components, and information about voltages applied to the respective components;

extraction means for extracting information about the insulation distances based on the information about voltages applied to the respective components;

connection detection means for detecting connections among components based on the information about the shapes of the components and the information about the layout of the components;

voltage system detection means for detecting voltage systems based on the connections among the components, the information about the voltages applied to the respective components, and the information about the materials of the respective components;

calculation means for calculating a creepage distance between the detected voltage systems; and comparison means for comparing the calculated creepage distance with the insulation distance.

2. A system according to claim 1, further comprising information output means for outputting information indicating whether the calculated creepage distance satisfies the insulation distance.

3. A system according to claim 2, further comprising a display means, wherein the information output means outputs information to the display means, the information indicating a creepage path that does not satisfy a creepage distance requirement.

4. A system according to claim 1, wherein the information about the materials of the respective components includes information about the electric conductivity of the materials.

5. A system according to claim 1, wherein the calculation means includes:

means for setting a weight for each component, depending on the electric conductivity of the component;

means for acquiring an arbitrary point on each voltage system; and means for calculating a shortest path between two points acquired by the acquisition means, taking into account the weights.

6. A system according to claim 5, wherein the means for calculating the shortest path taking into account the weights includes:
   detection means for detecting a topological structure of patches on the respective components;
   generation means for generating a discretely weighted approximate graph on the surfaces of the respective components;
   setting means for setting the weight assigned to each component to a corresponding edge of the graph;
   means for producing a graph connecting graphs of components;
   means for calculating a shortest path between weighted graphs;
   generation means for generating a graph of parts close to the obtained shortest path; and
   means for determining whether the calculation of the shortest path has converged to a solution.

7. A system according to claim 6, wherein the generation means includes:
   adjacent patch search means for searching for, to each node of a graph on a component, an adjacent patch that is located on another component and that is closest to the node among patches located within a predetermined range from the node;
   means for determining a closest point which is located on the detected closest adjacent patch and at which the distance between the node and the detected closest adjacent patch is shortest;
   means for employing the closest point as a node of a graph on a component to which the adjacent patch belongs;
   means for, when the graph on the adjacent patch includes an already existing node on the adjacent patch, producing an edge between the node at the closest point and the already existing node; and
   means for producing an edge extending from the node of interest to the node at the closest point.

8. A system according to claim 7, wherein the adjacent patch searching means includes:
   means for producing a tree structure of bounding boxes of patches forming respective components;
   means for putting into a queue a root node pair of bounding boxes of adjacent components;
   means for taking a root node pair from the queue and determining whether the distance between the bounding boxes of root nodes of the pair is less than a predetermined value;
   means for, if the distance is determined to be less than the predetermined value and if both nodes are leaf nodes, calculating the distance between the patches corresponding to the respective nodes and determining whether the patches are located close to each other;
   means for, if the distance is determined to be less than the predetermined value and if one node is a leaf node and the other is non-leaf node, producing a pair of a child node of the non-leaf node and the leaf node for each child node and again putting the produced pairs into the queue; and
   means for, if the distance is determined to be less than the predetermined value and if both nodes are non-leaf nodes, producing a pair of a child node done of the non-leaf nodes and the other non-leaf node for each child node and again putting the produced pairs into the queue.

9. A method of verifying an insulation distance of a system including a plurality of components among which voltage differences occur, comprising the steps of:
   detecting connections among the plurality of components on the basis of information about shapes of the plurality of components of the system and information about the layout of the plurality of components;
   grouping the components forming the system into voltage systems in accordance with the information about the voltages applied to the respective components and the information about the materials of the respective components;
   calculating a creepage distance between voltage systems along surfaces of components in the voltage systems for each possible pair of voltage systems into which the components are grouped; and
   comparing the calculated creepage distance with a required insulation distance predetermined depending on a voltage difference.

10. The method according to claim 9, wherein the information about materials of the components includes information about electrical conductivity of the materials.

11. The method according to claim 9, further comprising outputting information indicating whether the calculated creepage distance satisfies the insulation distance, as specified.

12. A storage medium including a computer program stored therein for executing a method of verifying an insulation distance of an system including a plurality of components among which voltage differences occur, the computer program comprising:
   a module for detecting connections among the plurality of components on the basis of information about shapes of the plurality of components of the system and information about the layout of the plurality of components;
   a module for grouping the components forming the system into voltage system in accordance with the information about the voltages applied to the respective components and the information about the materials of the respective components;
   a module for calculating a creepage distance between voltage systems along surfaces of components in the voltage systems for each possible pair of voltage systems into which the components are grouped; and
   a module for comparing the calculated creepage distance with a required insulation distance predetermined depending on a voltage difference.

13. A storage medium according to claim 12, wherein the information about materials of the components includes information about electrical conductivity of the materials.

14. A storage medium according to claim 12, wherein the computer program further comprises a module for outputting information indicating the result of the comparison.

15. A storage medium according to claim 12, wherein when the creepage distance does not satisfy the specified necessary insulation distance, the module for outputting information outputs information indicating the calculated creepage distance to be displayed.

16. A system for verifying insulation of a device including a plurality of components among which voltage differences occur, comprising:
   acquisition means for acquiring at least information about shapes of components of the device, information about the layout of the components, information about voltages applied to the respective components, and information about materials of the respective components;

extraction means for extracting information about required insulation distances determined depending on voltage differences among the components;

connection detection means for detecting connections among components on based on the information about the shapes of the components and the information about the layout of the components;

voltage system detection means for detecting voltage systems from the connections among the components, the information about the voltages applied to the respective components, and the information about the materials of the respective components;

means for extracting a voltage system pair;

means for determining, for each voltage system pair, a shortest component-to-component distance between voltage systems as a spatial shortest distance between the voltage systems, wherein a pair of voltage systems is extracted when the spatial shortest distance is smaller than the required insulation distance;

calculation means for calculating the creepage distance between voltage systems of each extracted voltage system pair; and comparison means for comparing the calculated, creepage distance with the insulation distance determined depending on the voltage difference, the insulation distance being extracted by the extraction means in accordance with the voltage difference between the voltage systems.

17. A system according to claim 16, further comprising:

means for producing a tree structure such that, for each pair of voltage systems, a shortest component-to-component distance between voltage systems is determined as a spatial shortest distance between the voltage systems, and, if the spatial shortest distance is smaller than the required insulation distance, a tree structure including leaf nodes corresponding to bounding boxes of respective voltage systems is produced;

means for extracting a voltage system having a bounding box that does not have a spatial distance greater than the required insulation distance;

means for producing, for each voltage system, a bounding box tree including leaf nodes corresponding to bounding boxes of components of each voltage system;

means for extracting, from the extracted voltage system pair, a pair of components having a bounding box that does not have a spatial distance greater than the required insulating distance;

means for producing a bounding box tree including leaf nodes corresponding to bounding boxes of patches of a polyhedron of each component;

means for determining a shortest spatial distance between components, on the basis of the bounding box trees; and means for comparing the determined shortest spatial distance between components of voltage systems of a voltage system pair with the required creepage distance, and, if the shortest spatial distance is smaller than required creepage distance, determining that the voltage system pair is not likely to satisfy the requirement in terms of the insulation distance.

18. A method of validating a predetermined distance between a plurality of components of a system, the plurality of components having voltage differences between them, the method comprising:

detecting connections among the plurality of components;

grouping the components of the system into voltage systems in accordance with the information about voltages applied to the respective components and information about the materials of the respective components;

calculating a creepage distance between voltage systems along surfaces of components in the voltage systems for each possible pair of voltage systems into which the components are grouped; and comparing the calculated creepage distance with the predetermined distance.

19. The method of claim 18 wherein the predetermined distance is based on a voltage difference.

20. The method of claim 18 wherein the connections are detected based on information about shapes of the plurality of components of the system and information about the layout of the plurality of components.

21. The method of claim 18 further comprising:

generating a tree structure such that, for each pair of voltage systems, a shortest component-to-component distance between voltage systems is determined as a spatial shortest distance between the voltage systems;

generating a tree structure including leaf nodes corresponding to bounding boxes of respective voltage systems if the spatial shortest distance is smaller than the predetermined distance;

extracting a voltage system having a bounding box that does not have a spatial distance greater than the predetermined distance;

generating, for each voltage system, a bounding box tree including leaf nodes corresponding to bounding boxes of components of each voltage system;

extracting, from the extracted voltage system pair, a pair of components having a bounding box that does not have a spatial distance greater than the predetermined distance;

generating a bounding box tree including leaf nodes corresponding to bounding boxes of patches of a polyhedron of each component;

determining a shortest spatial distance between components based on the bounding box trees;

comparing the determined shortest spatial distance between components of voltage systems of a voltage system pair with the creepage distance; and determining that the voltage system pair is not likely to satisfy the requirement in terms of the predetermined distance if the shortest spatial distance is smaller than the creepage distance.

22. The system of claim 5 wherein the means for calculating the shortest path taking into account the weights includes:

means for calculating a shortest path between weighted graphs; and generation means for generating a graph of parts close to the obtained shortest path.

23. The system of claim 22 wherein the generation means includes:

adjacent patch search means for searching for, to each node of a graph on a component, an adjacent patch that is located on another component and that is closest to the node among patches located within a predetermined range from the node.

24. The system of claim 23 wherein the adjacent patch searching means includes:

means for producing a tree structure of bounding boxes of patches forming respective components;

means for putting into a queue a root node pair of bounding boxes of adjacent components;

means for taking a root node pair from the queue and determining whether the distance between the bounding boxes of root nodes of the pair is less than a predetermined value;

means for, if the distance is determined to be less than the predetermined value and if both nodes are leaf nodes, calculating the distance between the patches corresponding to the respective nodes and determining whether the patches are located close to each other;

means for, if the distance is determined to be less than the predetermined value and if one node is a leaf node and the other is non-leaf node, producing a pair of a child node of the non-leaf node and the loaf node for each child node and again putting the produced pairs into the queue; and means for, if the distance is determined to be less than the predetermined value and if both nudes are non-leaf nodes, producing a pair of a child node of one of the non-leaf nodes and the other non-leaf node for each child node and again putting the produced pairs into the queue.

* * * * *